United States Patent
Jacobs et al.

(10) Patent No.: US 10,029,908 B1
(45) Date of Patent: Jul. 24, 2018

(54) DIELECTRIC CLADDING OF MICROELECTROMECHANICAL SYSTEMS (MEMS) ELEMENTS FOR IMPROVED RELIABILITY

(71) Applicant: TEXAS INSTRUMENTS INCORPORATED, Dallas, TX (US)

(72) Inventors: Simon Joshua Jacobs, Lucas, TX (US); Molly Nelis Sing, Murphy, TX (US); Kelly Jay Taylor, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/395,029

(22) Filed: Dec. 30, 2016

(51) Int. Cl.
| H01L 29/84 | (2006.01) |
| B81B 3/00 | (2006.01) |
| B81C 1/00 | (2006.01) |

(52) U.S. Cl.
CPC .......... *B81B 3/0075* (2013.01); *B81C 1/0038* (2013.01); *B81B 2207/07* (2013.01); *B81C 2201/0132* (2013.01); *B81C 2201/0176* (2013.01)

(58) Field of Classification Search
CPC . B81B 3/0064–3/0078; B81B 2207/07; B81B 2207/115; B81C 1/10038; B81C 1/0038
See application file for complete search history.

(56) References Cited

U.S. PATENT DOCUMENTS

| 6,136,208 A * | 10/2000 | Chou ................... B82Y 35/00 205/122 |
| 2008/0064219 A1* | 3/2008 | Jung ...................... G03F 7/427 438/703 |
| 2008/0087971 A1* | 4/2008 | Nakatani ............ B81C 1/00182 257/416 |
| 2010/0320555 A1* | 12/2010 | Miles .................... B81B 3/0086 257/433 |
| 2015/0008541 A1* | 1/2015 | Hong .................... B81B 3/0021 257/415 |

OTHER PUBLICATIONS

Perez-Rodriguez et al. , Etch-Stop Behavior of Buried Layers Formed by Substoichiometric Nitrogen Ion Implantation into Silicon, 1996, J. Electrochem. Soc., vol. 143, No. 3, pp. 1026-1033.*
Fiaz et al. , Metal additive manufacturing for microelectromechanical systems: Titanium alloy (Ti—6Al—4V)-based nanopositioning flexure fabricated by electron beam melting, Aug. 31, 2016, Sensors and Actuators A 249 (2016) 284-293.*

* cited by examiner

*Primary Examiner* — Syed Gheyas
(74) *Attorney, Agent, or Firm* — Michael A. Davis, Jr.; Charles A. Brill; Frank D. Cimino

(57) ABSTRACT

In described examples, a method of forming a microelectromechanical device comprises: forming a first metallic layer comprising a conducting layer on a substrate; forming a first dielectric layer on the first metallic layer, wherein the first dielectric layer comprises one or more individual dielectric layers; forming a sacrificial layer on the first dielectric layer; forming a second dielectric layer on the sacrificial layer; forming a second metallic layer on the second dielectric layer; and removing the sacrificial layer to form a spacing between the second dielectric layer and the first dielectric layer. Removing the sacrificial layer enables movement of the second dielectric layer relative to the first dielectric layer in at least one direction.

13 Claims, 3 Drawing Sheets

DIELECTRIC CLADDING OF MICROELECTROMECHANICAL SYSTEMS (MEMS) ELEMENTS FOR IMPROVED RELIABILITY

BACKGROUND

This relates generally to microelectromechanical systems (MEMS). MEMS devices may be characterized by their small size, because most are under 1 mm in size, and may be used in printer heads, micro heat exchangers, high-definition projectors, pressure sensors and infrared applications. For example, MEMS devices and radio-frequency (RF) MEMS devices may exhibit multiple failure mechanisms during testing and operation, including dielectric charging, stiction or adhesion, and wear and debris formation. Such failures may prevent and/or delay the release of a RFMEMS device for reliability concerns, because the failure mechanisms may cause various operating parameters to shift out of specification during reliability testing.

SUMMARY

In described examples, a method of forming a microelectromechanical device comprises: forming a first metallic layer comprising a conducting layer on a substrate; forming a first dielectric layer on the first metallic layer, wherein the first dielectric layer comprises one or more individual dielectric layers; forming a sacrificial layer on the first dielectric layer; forming a second dielectric layer on the sacrificial layer; forming a second metallic layer on the second dielectric layer; and removing the sacrificial layer to form a spacing between the second dielectric layer and the first dielectric layer. Removing the sacrificial layer enables movement of the second dielectric layer relative to the first dielectric layer in at least one direction.

In another example, the method further comprises: forming the first dielectric layer via atomic layer deposition (ALD) or plasma-enhanced chemical vapor deposition (PECVD), and forming the second dielectric layer via atomic layer deposition (ALD) or plasma-enhanced chemical vapor deposition (PECVD); and forming the sacrificial layer using a photoresist on the first dielectric layer. The first dielectric layer comprises a first layer of substoichiometric silicon nitride $SiN_x$. Also, the first dielectric layer comprises a second layer of $Al_2O_3$ formed on the first layer of substoichiometric silicon nitride $SiN_x$. The second dielectric layer comprises $Al_2O_3$ and has a thickness from 1 Angstrom to 500 Angstroms. In at least one example, the method further comprises: forming the sacrificial layer using a photoresist on the first dielectric layer, and removing the photoresist via etching using a plasma comprising fluorine. The second metallic layer comprises an aluminum-titanium alloy. The first metallic layer further comprises at least one barrier layer disposed on a first side of the conducting layer, on a second side of the conducting layer, or within the conducting layer. In some examples, the first metallic layer is formed without a barrier layer.

In a further example, an alternative method of forming a microelectromechanical device comprises: forming a metallic layer comprising a conducting layer on a substrate; forming a first dielectric layer on the first metallic layer, wherein the first dielectric layer comprises a first plurality of vias; forming a sacrificial layer on the first dielectric layer; forming a second metallic layer; removing the sacrificial layer; and forming a second dielectric layer on a plurality of surfaces. The surfaces comprise the first dielectric layer, a first side of the second metallic layer, and a second side of the second metallic layer. In at least one example, forming the second metallic layer comprises forming a second plurality of vias in the second metallic layer, and the second metallic layer is in contact with the first metallic layer by way of the second plurality of vias. Also, the method comprises: forming the first dielectric layer via atomic layer deposition (ALD) or plasma-enhanced chemical vapor deposition (PECVD), and forming the second dielectric layer via atomic layer deposition (ALD) or plasma-enhanced chemical vapor deposition (PECVD); and forming the sacrificial layer using a photoresist on the second dielectric layer, and removing the sacrificial layer via etching by a plasma comprising fluorine. The first dielectric layer comprises a substoichiometric silicon nitride $SiN_x$ film, the second dielectric layer comprises $Al_2O_3$ and has a thickness from 1 Angstrom to 500 Angstroms, and the second metallic layer comprises an aluminum-titanium alloy.

In yet another example, a microelectromechanical device comprises: a first metallic layer comprising a conducting layer formed on a substrate; a first dielectric layer formed on the first metallic layer; a second dielectric layer separated from the first dielectric layer by a void, such that at least a portion of the second dielectric layer is not in contact with a portion of the first dielectric layer; and a second metallic layer formed on the second dielectric layer. The void is configured to enable movement of the second dielectric layer and the second metallic layer relative to the first dielectric layer in at least one direction. The first dielectric layer comprises substoichiometric silicon nitride $SiN_x$ and $Al_2O_3$, the second metallic layer comprises an aluminum-titanium alloy, and the second dielectric layer comprises $Al_2O_3$ and has a thickness from 1 Angstrom to 500 Angstroms.

DETAILED DESCRIPTION

Figure 1A:
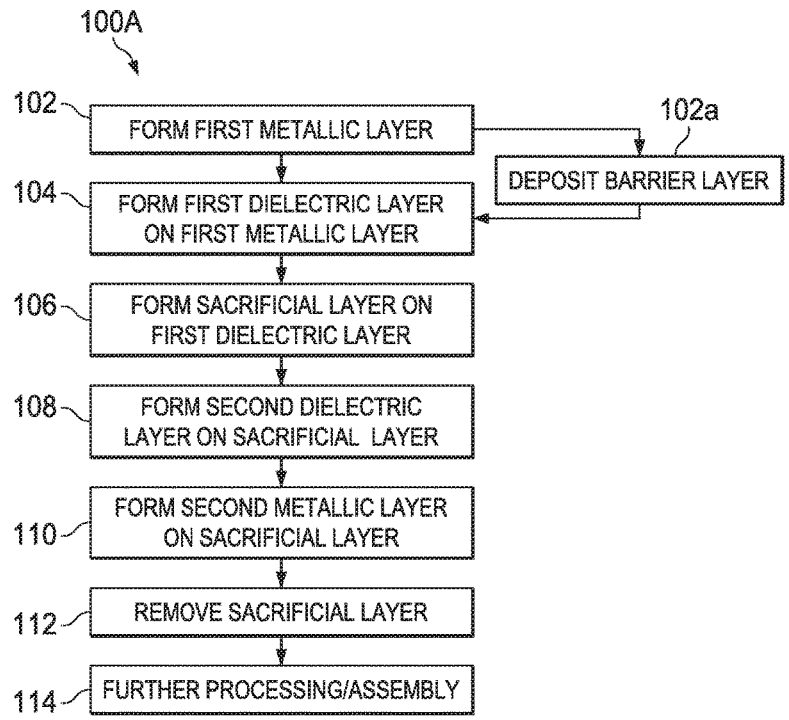
FIG. 1A is a flowchart of a method of fabricating MEMS devices according to example embodiments.

In this description, the term "about" may indicate values or ranges of values within +/−10% of the stated value.

During testing and use, a microelectromechanical systems (MEMS) device may experience failure modes, which may be caused (at least partially) by water in and around the device, such as atmospheric humidity. To address this problem, example embodiments apply a dielectric cladding in contact areas, such as hinges. The dielectric cladding may be applied before or after the use of a sacrificial layer, such that it forms a movable element with a metallic layer. The dielectric cladding may be in contact with another dielectric layer and may at least double a useful life of the MEMS device.

For modification of MEMS device surfaces, efforts may focus on modification of a native oxide surface with an organic material, which can bind or interact directly with the metal oxide or metal surface. However, those efforts may be insufficient to prevent certain degradation reactions from occurring at the surfaces of the device. As described herein, employing insulating dielectrics in MEMS devices may help to electrically insulate, and thereby remove, an electrode from an electrochemical cell formed between contacting surfaces with differing charge densities and/or electrical potentials. In this manner, degradation due to corrosion can be dramatically retarded by breaking the corrosion circuit. MEMS devices may be manufactured using metallic bases such as aluminum (Al)-copper (Cu) (Al—Cu) bases or other alloy systems. Various layers may be formed by deposition including sputtering or other methods, a sacrificial layer may be used during the process, and a part of this layer may be removed by wet or dry etching. The sacrificial layer is referred to as "sacrificial" because, although its formation and patterning may involve partial removal of the layer, the layer can be completely removed before the MEMS device is ready for use. The sacrificial layer may be useful if a moving structure is needed in the final device. Also, in order to have one layer separated from another layer, a sacrificial layer may be used (along with other features including columns and vias) to form this structure. A "via" as used herein refers to a feature in a multilayer structure that interconnects two or more of the layers. For example, a via may be a conductive structure that electrically interconnects to layers. Vias may be formed in a variety of cross-sectional shapes. The vias may be formed when forming the sacrificial layer, and/or when forming other layers, as each layer is formed, and/or before forming subsequent layers. In alternative embodiments, the vias may be formed in more than one layer at the same time, such as when two or more layers are patterned in whole or in part simultaneously. Various methods of etching are described herein. For example, dry etching is a process that removes material (e.g., material of the sacrificial layer) by exposing the material to an ion bombardment, such as in a plasma of reactive gases. Wet etching is process in which wet chemical etchants are employed to remove parts of the sacrificial material.

Example embodiments include a method of manufacturing and use of a dielectric film that is formed by atomic layer deposition (ALD) or other suitable low-temperature deposition technique (e.g., plasma-enabled chemical vapor deposition (PECVD)) to provide a cladding on at least a portion of a surface of a moveable metallic MEMS element. In some embodiments, the dielectric film may have a thickness of 1-250 Angstrom (Å). As described herein, a MEMS device may comprise a plurality of MEMS elements. The cladding may be employed to prevent the onset of electrochemical degradation which otherwise may occur without the cladding. MEMS devices may comprise complicated geometries including corners and hinges that may be mating or contact features among and between components in a larger device comprising a plurality of MEMS devices. The cladding described herein may be applied to targeted areas including hinge areas or may be applied to other areas or to an entire MEMS device, as described herein. The described cladding may reduce or eliminate failures due to charging, particle growth, and stiction. Such failures may otherwise occur during testing and during normal use by customers. The reduction or elimination of such failures can improve the customer experience.

In an embodiment, a thin (e.g., 1-250 Å) dielectric film can be formed on a surface of a MEMS device. The deposited dielectric film can contribute to the improved reliability of the MEMS device and devices comprising an array of such MEMS devices. During manufacturing, the dielectric cladding attenuates the mechanical and chemical interaction between a photoresist and other layers. The other layers may be formed via a sputtering process. The dielectric cladding layer can be employed to lessen the distance between metal contact surfaces of MEMS elements in a MEMS device to thereby increase capacitance.

Because many MEMS devices are designed for repeated actuation, example embodiments address the minimization of these reactions, such as the reduction or elimination of water molecules from the ambient air or other sources that may cause or further promote the undesirable chemical reactions. The repeated actuation described herein may be impeded by previously employed components because of the tough-to-brittle transition that may occur because of chemical reactions resulting from the thinness of layers. Dielectric cladding may increase the stiffness and operating voltage of components, so it may not be conventionally desirable to use such a cladding. However, using the methods described herein, the dielectric cladding layer can be applied at an Angstrom level, with an example thickness of 1 to 250 Å, which may not lead to an increased stiffness of the MEMS devices to which it is applied. As a result, the described dielectric film may not impede the actuation of the MEMS device. The formation of the MEMS elements and resulting devices described herein includes forming metallic, dielectric, sacrificial and other layers.

The "forming" of the various layers of MEMS elements and devices described herein may be accomplished in any suitable manner and can comprise deposition by sputtering, CVD, PVD, ALD, or other types of processes. The forming process may comprise steps such as exposure to ultraviolet radiation and/or heat, and patterning including partial etching, in addition to other mechanical, thermal, or thermal-mechanical processes, or combinations thereof. In the case of sacrificial layers, layers such as photoresists and oxides are referred to herein as such, because they may undergo various processes as part of the "forming" step, but then a removal process is also performed in which the entire layer is eliminated from the structure, such that it does not appear in the final structure. Also, when the sacrificial layer is formed, part of this formation may be to form vias that may be repeated in the formation of other layers, such that the vias enable contact between two metallic layers. Thus, in some embodiments, formation of the various layers may also include patterning vias or troughs that are designed as through-holes so that the first metallic layer and the second metallic layer have points of contact. Some embodiments include moveable elements. These are the MEMS elements of the MEMS device that may be defined by a combination of the second metal layer and the second dielectric layer, such that the second dielectric layer (cladding) tenaciously protects the metallic layers from degradation.

Example advantages of using the described cladding include: (a) providing an insulating barrier which attenuates the injection of charge into the layer which the moveable member contacts during operation; (b) providing a moisture barrier which attenuates electrochemical oxidation and reduction reactions at the metal surface of the moveable element(s); and (c) attenuating the formation of an electrochemical double layer on the surface of the moveable element by attenuating the electric field at the surface of the element.

In some embodiments, the cladding described herein is thin enough to tolerate distortion due to the motion of the moveable element, without failure due to bending, peeling or cracking over an expected service lifetime of the component. The cladding may also be configured as to reduce or prevent arcing and other electrical discharge phenomena which can occur without such cladding, because the cladding acts to reduce the peak electric fields occurring at contact.

In various embodiments, dielectric cladding layers may comprise materials that: (a) can be formed at low temperature with a low density of defects (defect density otherwise can lead to physical pinholes or electrical traps which may receive an excessive charge); (b) can be formed directly on top of cured photoresist or thin films which overlie cured photoresist; (c) have a coefficient of thermal expansion (CTE) similar to that of the metal layer which they protect; and/or (d) form an inorganic moisture barrier at the deposited thickness that protects the integrity of the component and a field barrier that may have the effect of lowering the voltage when free space is encountered.

In various embodiments, integration of dielectric cladding layers (films) into MEMS devices may include patterning, etching, and cleaning steps to remove them from certain areas of the wafer if so desired for the operation of the device. These films comprise a low-to-zero etch rate in the final release treatment of the device, such that the cladding may remain substantially intact in the final released form of the MEMS device. In alternative embodiments, the dielectric films may be formed after final MEMS release (e.g., after etching) if deposited through a layer-by-layer deposition technique such as ALD. MEMS devices comprising the described dielectric cladding layer exhibit a greater device service lifetime (e.g., two or more orders of magnitude greater) due to the use of the dielectric cladding layer.

In an embodiment, the dielectric cladding layer may comprise $Al_2O_3$ and may have a thickness that is controlled during the deposition process. The formation of $Al_2O_3$ may be largely inert due to the plasma chemistry of the etch process. Surface micromachining may be used in some embodiments to form thin layers of metals and/or metal alloys, and some structures may use dielectric materials to form stop layers. Further, photoresists may be used as sacrificial material and removed after various points in the process by plasma etching with downstream plasma, which may comprise fluorine in the form of $CF_4$ and an oxygen component. Such techniques may be in contrast to other processes that may use polysilicon as the structural layer and oxides as the sacrificial layers. To form the dielectric cladding described herein, aluminum and aluminum alloys may be employed to form a surface oxide which becomes fluorinated. The F—O bond is stronger than the Al—O bond, and Al is resistant to etching, thereby rendering the cladding layer effective because of the improved selectivity of the cladding layer. However, polysilicon and/or oxides can also be used with the cladding described herein with compatible formation techniques.

In a first example of a method of forming the dielectric cladding, a metallic layer is formed on a silicon wafer. This first metallic layer may comprise a conductive layer (such as Al—Cu) and may comprise a barrier layer (such as TiN) disposed on the top, bottom or within the conductive layer to prevent the Al from migrating into subsequent layers. A first dielectric layer that may comprise $SiO_2$ and/or a substoichiometric $SiN_x$ is formed on the first metallic layer. In some embodiments, the first dielectric layer may comprise more than one layer of varying compositions, including a first layer of $SiN_x$ and a second layer of $Al_2O_3$. A sacrificial layer can be formed on the first dielectric layer, and a second dielectric layer that may comprise $Al_2O_3$ can be disposed (e.g., via ALD or PECVD) on the sacrificial layer. In some embodiments, the second dielectric layer may have a thickness in the range of about 1 Å to about 500 Å. A second metallic layer may be formed on the second dielectric layer. The sacrificial layer may be removed, leaving the movable element (second metallic layer) attached to the second dielectric layer. Pluralities of vias may be formed in the various layers described hereinabove, such that (in some embodiments) the second metallic layer is in contact with the first metallic layer by way of the vias.

In a second example of the method of forming the dielectric cladding, a first dielectric layer that may comprise SiN can be disposed on the first metallic layer, a sacrificial layer may be formed on the first dielectric layer. The second metallic layer can then be formed on the sacrificial layer, after which point the sacrificial layer can be removed. A second dielectric layer that may comprise $Al_2O_3$ can then be formed on the entire device subsequent to removal of the sacrificial layer. This means that the second dielectric layer is in contact with both sides of the second metallic layer, and with the first dielectric layer. The second dielectric layer may also be described in this case as encasing the metal membrane, e.g., the second metallic layer of the MEMS device. The second dielectric layer may be from about 1 Å to about 500 Å.

FIG. 1A illustrates a method 100A of fabricating MEMS devices according to example embodiments. At block 102 of FIG. 1, a first metallic layer can be formed on a silicon wafer. The first metallic layer may comprise a conductive layer of an Al—Cu alloy and, in some embodiments, a barrier layer. In an embodiment where a barrier layer is employed in or on the conductive layer, at block 102a a barrier structure comprising one or more barrier layers may be disposed on a first side, a second side, or within the conducting layer. In some embodiments, no barrier layer is disposed, block 102a is skipped, and the method proceeds to block 104 where a first dielectric layer is formed on the first metallic layer. As described hereinabove, the formation of some or all layers may comprise vias (holes) that may allow contact between metal layers. The vias may be formed in single layers, or may be formed in multiple layers at once (simultaneously). Also, in embodiments where a barrier structure is employed at block 102a on top of the conductive layer of the first metallic layer, vias may exist in that structure. In some embodiments, the barrier layer(s) disposed at block 102a comprises TiN and is disposed in one or more separate layers to a total thickness from 50 Å to about 2500 Å via a sputtering process. In an embodiment, the barrier layer acts to inhibit the migration/diffusion of the metallic substrate into subsequent layers, e.g., contact surfaces.

In an example embodiment, at block 104, a first dielectric layer may be formed by a PECVD on the metallic substrate. The first dielectric layer formed at block 104 may comprise a sub-stoichiometric composition $SiN_x$ and may be formed to a thickness from between about 50 Å to about 10,000 Å. In some embodiments, the first dielectric layer may be from about 1500 Å to about 5000 Å. In one example, the formation of the first dielectric layer at block 104 may comprise the formation of a layer of a thickness from 1000 Angstroms to about 3000 Angstroms. The first dielectric layer may be formed as to comprise a plurality of vias configured to expose portions the first metallic layer formed at block 102. The first dielectric layer formed at block 104 may be formed in one or more steps and may comprise one or more layers and materials. In one embodiment, the first dielectric layer is formed at block 104 by first forming a layer of substoichiometric $SiN_x$ on the first metallic layer and then forming a layer of $Al_2O_3$ on the $SiN_x$. In this example, the individually formed layers of $SiN_x$ and $Al_2O_3$ may have a total thickness from between about 50 Å to about 10,000 Å, and each layer may have the same thickness or a different thickness, depending upon the embodiment.

In the example method 100A, at block 106, a sacrificial layer can be formed on the first dielectric layer. This formation may comprise exposing the layer such as a photoresist to UV, chemically or mechanically patterning and/or selectively etching the layer, and forming vias through the layer. At block 108, a second dielectric layer may be deposited. This second dielectric layer may comprise $Al_2O_3$, and may be deposited via ALD or PECVD to a thickness from 1 Angstrom to 500 Angstroms, such that the cladding does not embrittle the device during deposition or during repeated actuation of the device. At block 110, a second metallic layer that may comprise aluminum is formed on the second dielectric layer. The vias are formed as to be aligned among and between layers, such that the second metallic layer is in contact with the first metallic layer through the vias.

At block 112, the sacrificial layer formed at block 106 can be removed (e.g., completely, or substantially completely), such as by plasma etching, so the photoresist is absent from the final MEMS device structure. The etching at block 112 may be performed via plasma etching using a plasma that contains fluorine, and does not inhibit the integrity or properties of the second dielectric layer deposited at block 106. The movable element, comprising the second metallic layer and the second dielectric layer, is then separated from the first dielectric and first metallic layers by a void created by the removal of the sacrificial structure. At block 114, the MEMS device may be further processed. Such additional processing may include heat treatments, assembly, and packaging.

Figure 1B:
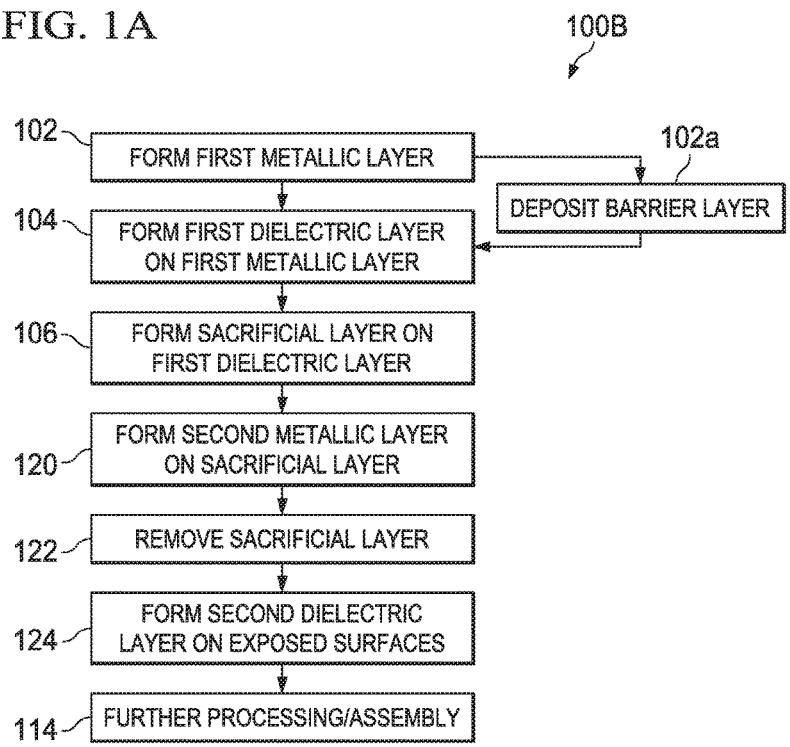
FIG. 1B is a flowchart of a method of fabricating MEMS devices according to an alternative embodiment.

FIG. 1B illustrates a method 100B of fabricating MEMS devices according to an alternative embodiment. In this alternative embodiment, the blocks 102, 102a, 104 and 106 may be similar to those in FIG. 1A. However, in the method 100B, subsequent to forming the sacrificial layer on the first dielectric layer at block 106, a second metallic layer can be formed on the sacrificial layer at block 120. This second metallic layer may comprise Al, and may be disposed at a thickness from about 3000 Å to about 5000 Å. At block 122, the sacrificial layer can be completely removed from the structure, leaving a space or a void between the second metallic layer and the first dielectric layer, such that the bottom side of the second metallic layer is exposed. The removal of the sacrificial layer at block 122 may be via etching by a fluorine-containing plasma. At block 124, subsequent to removing the sacrificial layer at block 122, a second dielectric layer is formed on the second metallic layer. The second dielectric layer may be formed at block 124 using ALD, which enables the second dielectric layer material, such as $Al_2O_3$, to be disposed as a vapor. Thus, the formation of the second dielectric layer at block 122 serves to coat the second metallic layer and all of the exposed surfaces, including the top surface of the first dielectric layer, and both sides of the second metallic layer (e.g., the top side and the bottom side that was in contact with the sacrificial layer before removal). Accordingly, the ALD coating process forms the second dielectric layer on all exposed surfaces, including in the pluralities of vias formed in the various structures and other patterned features of the structure. Subsequent to the formation of the second dielectric layer at block 124, the MEMS structure may undergo further processing at block 114 similar to what is described at block 114 in FIG. 1A.

Figure 2A:
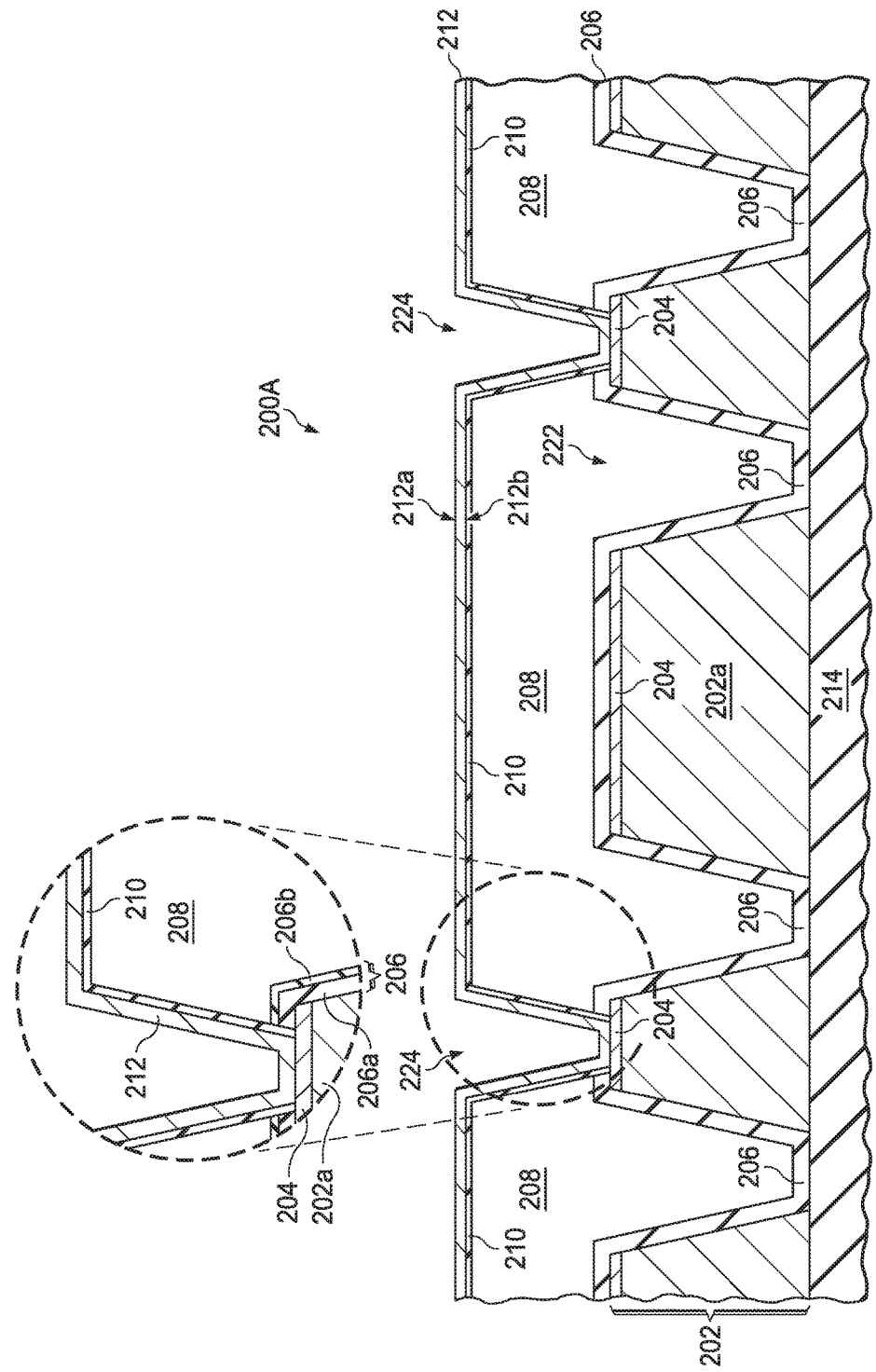
FIG. 2A is a schematic partial cross-section view of a MEMS device comprising a dielectric cladding according to example embodiments.

FIG. 2A shows a partial cross-section 200A of a MEMS device comprising a dielectric cladding according to example embodiments. In FIG. 2A, the MEMS device 200A may include a silicon substrate 214, and a first metallic layer 202 formed on the substrate 214 that may comprise a conductive layer 202a. While an example structure is shown in FIG. 2A, the patterned features of a MEMS device may comprise varying features and shapes. For example, such shapes may be concave, convex and/or comprise multiple transition surfaces that may be smooth, sharp or have graded transitions. The conductive layer 202a may comprise metals such as Al—Cu alloys of a thickness $T_{202}$ from about 0.5 microns to about 3 microns. In some embodiments, the first metallic layer 202 comprises a barrier layer 204 that may be disposed on top of the conductive layer 202a, as shown in FIG. 2A. In alternative embodiments, the barrier layer 204 may be disposed below the conductive layer 202a (i.e., on the opposite side of what is shown in FIG. 2A). In still other embodiments, the barrier layer 204 may be part of the first metallic layer 202, such that it is disposed at least in part within the conductive layer 202a. In various embodiments, the barrier layer 204 may comprise TiN. The barrier layer 204 may include a separate structure or may be part of the conductive layer 202a. The barrier layer 204 may be formed as a single layer or as a plurality of individual layers. The barrier layer 204 acts as a diffusion barrier for the first metallic layer 202.

In an embodiment, a first dielectric layer 206 is formed on the first metallic layer 202, such as on the barrier layer 204. The first dielectric layer 206 may comprise sub-stoichiometric $SiN_x$ 206a, and in some embodiments, as shown in FIG. 2A, may further comprise a second dielectric layer 206b, that may comprise $Al_2O_3$. The first dielectric layer 206 may have a total thickness $T_{206}$, in some examples, from about 1000 Å to about 3000 Å. A plurality of vias 222 may be formed through the first metallic layer 202, the first dielectric layer 206 may be disposed as to coat some or all surfaces of the vias 222. The layers 206a and 206b may vary in thickness among and between embodiments, such that the layers may be of equal or differing thicknesses.

In an embodiment, a void 208 exists between the first dielectric layer 206 and a second dielectric layer 210. This void 208 may be formed as described hereinabove, using a sacrificial layer. In an embodiment, the void 208 may comprise height $T_{208}$ from about 0.3 microns to about 1 micron between the first dielectric layer 206 and the second dielectric layer 210. This void 208 may comprise larger heights in via 222 locations. The second dielectric layer 210 comprises $Al_2O_3$ and has a thickness $T_{210}$ from about 1 Å to about 500 Å and, in the example in FIG. 2A, the second dielectric layer 210 was deposited on the sacrificial layer before its removal and formation of the void 208.

In an embodiment, the second dielectric layer 210 and a second metallic layer 212 formed on the second dielectric layer comprise a second plurality of vias 224. In an embodiment, the second metallic layer comprises an aluminum alloy, a titanium alloy, or combinations and alloys thereof. In contrast with FIG. 2B (described hereinbelow), the second dielectric layer 212 is in contact with the second side 212b of the second metallic layer 212, but not in contact with the first side 212a. In some embodiments, the plurality of vias 224 is formed, such that a portion of the second metallic layer 212 is in contact with at least one of the first metallic layer 202 by way of the vias. In an embodiment, the second metallic layer 212 has a thickness $T_{212}$ from about 3000 Å to about 6000 Å. The inset "A" in FIG. 2A is a magnified view of a section of the device 200A. The inset A shows the void 208, the first dielectric layer 206 that comprises $SiN_x$ 206a and $Al_2O_3$ 206b, and illustrates an embodiment where the buffer layer 204 is disposed on top of the conductive layer 202a to form the first metallic layer 202.

In some embodiments additional, multiple layers may be formed, including being patterned, together, such that vias and other features are formed simultaneously in multiple layers. Since, as described herein, the moveable elements of the device are formed by a combination of the second metallic layer 212 and the second dielectric layer 210, the second dielectric layer 210 can protect the second metallic layer 212 from degradation during use. In any of the embodiments, the removal of the sacrificial layer 208 leaves the second dielectric layer 210 and the second metallic layer 212 in contact, so the second dielectric layer 210 is attached to the moving (movable) metal element.

Figure 2B:
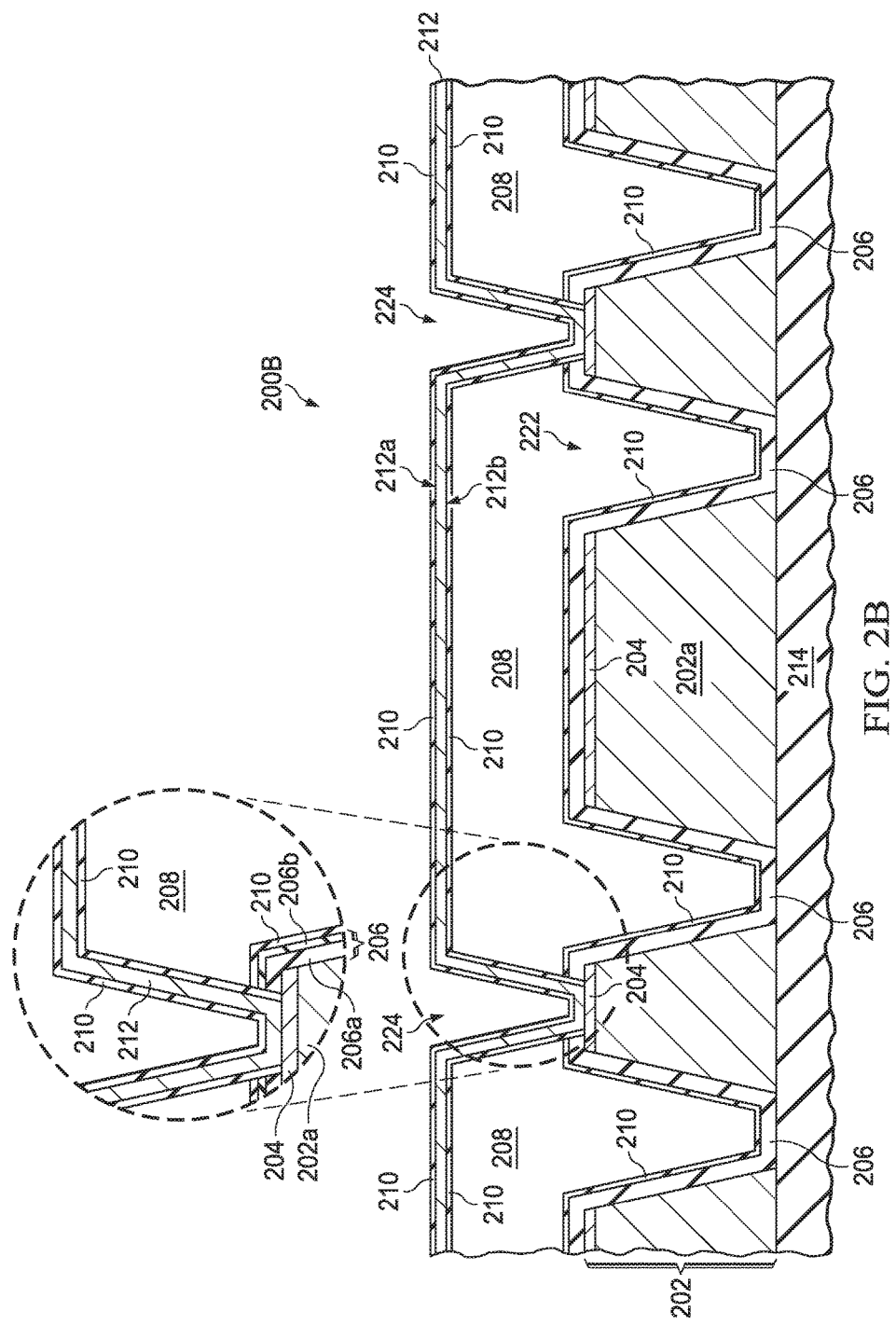
FIG. 2B is a schematic partial cross-section view of a MEMS device comprising a dielectric cladding according to an alternative embodiment.

FIG. 2B shows a partial cross-section 200B of a MEMS device comprising a dielectric cladding according to an alternative embodiment. In FIG. 2B (similar to FIG. 2A), the MEMS device 200B may include a substrate 214 and a first metallic layer 202 that may comprise a conductive layer 202a. In an embodiment, the substrate 214 may be a wafer substrate that comprises silicon and, in alternative embodiments, glass, sapphire, SiC, or other flat substrates suitable for MEMS applications. The first metallic layer 202 may comprise metals such as Al—Cu alloys of a thickness $T_{202}$ from about 0.5 microns to about 3 microns. Also, first dielectric layer 206 is formed in contact with the first metallic layer 202. The layers 202 (202a, 204) and 206 may be similar to those described with respect to FIG. 2A. Also, similarly to the structure in FIG. 2A, the void 208 in FIG. 2B is formed by the formation of a sacrificial layer on the first dielectric layer 206. However, in the cross-section 200B in contrast to that of 200A in FIG. 2A, the second dielectric layer 210 is formed on all surfaces that are exposed during its deposition. In one example as shown in FIG. 2B, the second dielectric layer 210 exists on both the first side 212a and the second side 212b of the second metallic layer 212, and on the first dielectric layer 206. As described with respect to at least the method 100B in FIG. 1B, the second dielectric layer 210 exists on all surfaces that are exposed during its deposition, including the vias 224. The presence of the layer 210 on those surfaces is because the second dielectric layer 210 is formed by a process such as ALD, so the vapor can access all of the exposed surfaces, including the first side 212a and the second side 212b of the second metallic layer 212, and on the first dielectric layer 206.

Modifications are possible in the described embodiments, and other embodiments are possible, within the scope of the claims.

What is claimed is:

1. A method of forming a microelectromechanical device, the method comprising:
    forming a first metallic layer comprising a conducting layer on a substrate;
    forming a first via in the conducting layer;
    forming a first dielectric layer on the first metallic layer, wherein the first dielectric layer comprises one or more individual dielectric layers;
    forming a sacrificial layer on the first dielectric layer;
    forming a second via in the sacrificial layer, wherein the second via extends to the first dielectric layer;
    forming a second dielectric layer on the sacrificial layer;
    forming a second metallic layer on the second dielectric layer;
    and
    removing the sacrificial layer to form a spacing between the second dielectric layer and the first dielectric layer, wherein removing the sacrificial layer enables movement of the second dielectric layer relative to the first dielectric layer about the second via.

2. The method of claim 1, further comprising forming the first dielectric layer via atomic layer deposition (ALD) or plasma-enhanced chemical vapor deposition (PECVD), and forming the second dielectric layer via atomic layer deposition (ALD) or plasma-enhanced chemical vapor deposition (PECVD).

3. The method of claim 1, further comprising forming the sacrificial layer using a photoresist on the first dielectric layer.

4. The method of claim 1, wherein the first dielectric layer comprises a first layer of substoichiometric silicon nitride $SiN_x$.

5. The method of claim 4, wherein the first dielectric layer further comprises a second layer of $Al_2O_3$ formed on the first layer of substoichiometric silicon nitride $SiN_x$.

6. The method of claim 1, wherein the second dielectric layer comprises Al2O3 and has a thickness from 1 Angstrom to 500 Angstroms.

7. The method of claim 1, further comprising forming the sacrificial layer using a photoresist on the first dielectric layer, and removing the photoresist via etching using a plasma comprising fluorine.

8. The method of claim 1, wherein the second metallic layer comprises an aluminum-titanium alloy.

9. The method of claim 1, wherein the first metallic layer further comprises at least one barrier layer disposed on a first side of the conducting layer, on a second side of the conducting layer, or within the conducting layer.

10. The method of claim 1, wherein the first metallic layer is formed without a barrier layer.

11. A microelectromechanical device, comprising:
    a first metallic layer comprising a conducting layer formed on a substrate, wherein the first metallic layer includes a via extending to the substrate;
    a first dielectric layer formed on the first metallic layer;
    a second dielectric layer separated from the first dielectric layer by a void, such that at least a portion of the second dielectric layer is not in contact with a portion of the first dielectric layer; and
    a second metallic layer formed on the dielectric layer, wherein the second metallic layer and the second dielectric layer include a second via that extends to the first dielectric layer, and wherein the void is configured to enable movement of the second dielectric layer and the second metallic layer relative to the first dielectric layer about the second via.

12. The device of claim 11, wherein the first dielectric layer comprises substoichiometric silicon nitride $SiN_x$ and $Al_2O_3$, and the second metallic layer comprises an aluminum-titanium alloy.

13. The device of claim 11, wherein the second dielectric layer comprises $Al_2O_3$ and has a thickness from 1 Angstrom to 500 Angstroms.

* * * * *